US 6,524,948 B2

(12) United States Patent
Tamaoka et al.

(10) Patent No.: US 6,524,948 B2
(45) Date of Patent: Feb. 25, 2003

(54) SEMICONDUCTOR DEVICE AND METHOD FOR FABRICATING THE SAME

(75) Inventors: Eiji Tamaoka, Nishinomiya (JP); Hideo Nakagawa, Omihachiman (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/974,053

(22) Filed: Oct. 11, 2001

(65) Prior Publication Data

US 2002/0043673 A1 Apr. 18, 2002

(30) Foreign Application Priority Data

Oct. 13, 2000 (JP) ........................................ 2000-313428

(51) Int. Cl.$^7$ ............................................. H01L 21/4763
(52) U.S. Cl. ...................... 438/637; 438/622; 438/623; 438/624
(58) Field of Search ............................... 438/622, 623, 438/624, 637

(56) References Cited

U.S. PATENT DOCUMENTS

| | | | | |
|---|---|---|---|---|
| 6,064,118 A | * | 5/2000 | Sasaki | |
| 6,242,336 B1 | | 6/2001 | Ueda et al. | |
| 6,239,016 B1 | * | 5/2002 | Ishikawa | |
| 2002/0015469 A1 | * | 2/2002 | Tamaoka et al. | |
| 2002/0025653 A1 | * | 2/2002 | Sasaki | |
| 2002/0048928 A1 | * | 4/2002 | Nakagawa et al. | |
| 2002/0060354 A1 | * | 5/2002 | Nakagawa et al. | |

OTHER PUBLICATIONS

T. Ueda et al., "Integration of 3 Level Air Gap Interconnect for Sub–quarter Micron CMOS", Symposium on VLSI Technology Digest of Technical Papers, pp. 111–112, 1999.
T. Ueda et al., "A Novel Air Gap Integration Scheme for Multi–level Interconnects using Self–aligned Via Plugs", Symposium on VLSI Technology Digest of Technical Papers, pp. 46–47, 1998.

* cited by examiner

*Primary Examiner*—Long Pham
(74) *Attorney, Agent, or Firm*—Nixon Peabody LLP; Donald R. Studebaker

(57) ABSTRACT

After a conductive film and a lower interlayer insulating film are formed successively on a semiconductor substrate, a lower plug connected to the conductive film is formed in the lower interlayer insulating film. Then, etching is performed sequentially with respect to the lower interlayer insulating film and the conductive film by using a mask pattern and the lower plug as a mask, thereby forming a lower-layer wire composed of the conductive film and connected to the lower plug. Thereafter, an upper interlayer insulating film is formed such that air gaps are formed in the wire-to-wire spaces of the lower-layer wire. Subsequently, an upper plug connected to the lower plug is formed in the upper interlayer insulating film. After that, an upper-layer wire is formed on the upper interlayer insulating film to be connected to the upper plug.

8 Claims, 11 Drawing Sheets

SEMICONDUCTOR DEVICE AND METHOD FOR FABRICATING THE SAME

BACKGROUND OF THE INVENTION

The present invention relates to a semiconductor device having multi-layer wires and a method for fabricating the same. More particularly, it relates to the structure of a plug for connecting a lower-layer wire having an air gap in a wire-to-wire space to an upper-layer wire and to a method for forming the same.

As semiconductor devices have become higher in integration and performance in recent years, wires in the semiconductor devices have increasingly been reduced in size and placed in multiple layers. The size reduction and multilayer placement of the wires increases a wire-to-wire capacitance, which adversely affects the operating speed of a semiconductor element. To prevent this, a method of scaling down the wires or placing the wires in multiple layers, while reducing the wire-to-wire capacitance, has been required.

To reduce the wire-to-wire capacitance, an insulating material with a low relative dielectric constant may be used for an interlayer insulating film. To further reduce the wire-to-wire capacitance, an air gap may also be formed in a wire-to-wire space (region lying between a pair of adjacent wires).

Referring to the drawings, a description will be given herein below to a conventional method for fabricating a semiconductor device as disclosed in technical papers by T. Ueda et al. ((1) A Novel Air Gap Integration Scheme for Multi-level Interconnects using Self-aligned Via Plugs: 1998 Symposium on VLSI Technology Digest of Technical Papers, P.46, 1998., (2) Integration of 3 Level Air Gap Interconnect for Sub-quarter Micron CMOS: 1999 Symposium on VLSI Technology Digest of Technical Papers, P.111, 1999, and the like), specifically a method for forming multilayer wires having air gaps.

FIGS. 8A to 8C, FIGS. 9A to 9C, and FIGS. 10A to 10C are cross-sectional views illustrating the individual process steps of the conventional method for fabricating a semiconductor device.

First, as shown in FIG. 8A, an underlying insulating film 11 composed of a silicon dioxide, a first conductive film 12 composed of an aluminum alloy with a thickness of 600 nm, and a first interlayer insulating film 13 composed of a silicon dioxide with a thickness of 1500 nm are deposited successively on a semiconductor substrate 10 composed of silicon. Then, a mask pattern 14 having an opening corresponding to a region to be formed with a plug is formed on the first interlayer insulating film 13.

Next, etching is performed with respect to the first interlayer insulating film 13 by using the mask pattern 14, thereby forming a connection hole 15 reaching the first conductive film 12 and having a diameter of about 400 nm, as shown in FIG. 8B. Thereafter, the mask pattern 14 is removed.

Next, a second conductive film composed of tungsten is deposited by vapor deposition or the like over the entire surface of the first interlayer insulating film 13 including the connection hole 15 such that the connection hole 15 is filled fully with the second conductive film. Then, the portion of the second conductive film located externally of the connection hole 15 is polished away by CMP (chemical mechanical polishing), whereby a plug 16 connected to the first conductive film 12 is formed, as shown in FIG. 8C.

Next, as shown in FIG. 9A, the first interlayer insulating film 13 is etched back to have a thickness of about 300 to 600 nm such that an upper portion of the plug 16 protrudes from an upper surface of the first interlayer insulating film 13. This effects control of the position of a top portion of each of air gaps 20 (see FIG. 10A), which will be formed in the subsequent step.

Next, as shown in FIG. 9B, a resist pattern 17 covering a region to be formed with a lower-layer wire is formed on the first interlayer insulating film 13.

Next, as shown in FIG. 9C, etching is performed sequentially with respect to the first interlayer insulating film 13 and the first conductive film 12 by using the resist pattern 17 and the plug 16 as a mask, thereby forming a lower-layer wire 12A composed of the first conductive film 12 and connected to the plug 16.

In the step illustrated in FIG. 9C, etching is also performed with respect to the underlying insulating film 11 by using the resist pattern 17 and the plug 16 as a mask after the formation of the lower-layer wire 12A, thereby removing the surface portions of the underlying insulating film 11 located under the wire-to-wire spaces of the lower-layer wire 12A to a depth of about 300 nm.

Next, the resist pattern 17 is removed. Then, as shown in FIG. 10A, a second interlayer insulating film 18 composed of a silicon dioxide, which is high in directivity and low in coverage rate, and having a thickness of about 200 to 500 nm is deposited over the entire surface of the semiconductor substrate 10 by plasma CVD using silane gas and dinitrogen oxide gas. Subsequently, a third interlayer insulating film 19 composed of a silicon dioxide having an excellent burying property and a thickness of about 1000 nm is deposited by high-density plasma CVD, whereby the air gaps 20 are formed in the wire-to-wire spaces of the lower-layer wire 12A.

Next, as shown in FIG. 10B, the second interlayer insulating film 18 and the third interlayer insulating film 19 are polished by CMP till the plug 16 is exposed such that the respective upper surfaces of the second and third interlayer insulating films 18 and 19 are planarized to be flush with the upper surface of the plug 16.

Next, as shown in FIG. 10C, an upper-layer wire 21 is formed over the planarized second and third interlayer insulating films 18 and 19 to be connected to the plug 16, whereby a two-layer wire structure is completed.

Thus, the conventional method for fabricating a semiconductor device has formed the plug 16 for electrically connecting the lower-layer wire 12A and the upper-layer wire 21 prior to formation of the lower-layer wire 12A and then formed the lower-layer wire 12A by patterning the first conductive film 12 by using the plug 16 as a mask. This prevents displacement between the plug 16 and the lower-layer wire 12A and thereby improves the reliability of the multilayer wires.

To lower the positions of the respective top portions of the air gaps 20 formed in the wire-to-wire spaces of the lower-layer wire 12A, however, the conventional method for fabricating a semiconductor device has etched back the first interlayer insulating film 13 such that the upper portion of the plug 16 protrudes from the upper surface of the first interlayer insulating film 13, as shown in FIG. 9A. Consequently, the resist pattern 17 is formed on the rugged underlie, as shown in FIG. 9B. As a result, the accuracy of pattern exposure is lowered and the resist pattern 17 may be deformed or the formed resist pattern 17 may partly collapse, which renders the size reduction of the resist pattern 17 difficult and renders the scaling down of the lower-layer wire 12A, i.e., the multilayer wires difficult.

If the plug 16 is formed to have an upper portion not protruding from the upper surface of the first interlayer insulating film 13, the top portion of the air gap 20 may reach a height equal to the height of the upper surface of the plug 16. In this case, the air gap 20 has an opening formed in the upper surface of the planarized second interlayer insulating film 18 or third interlayer insulating film 19 in the polishing step performed with respect to the second interlayer insulating film 18 and the third interlayer insulating film 19 (see FIG. 10B) so that the conductive film serving as the upper-layer wire 21 enters the opening. This causes a formation defect such as a breakage in the upper-layer wire 21 and reduces the reliability of the multilayer wires.

With the increasing miniaturization of semiconductor devices, there are a growing number of cases where plugs connecting lower-layer and upper-layer wires have been placed in close proximity.

FIG. 11 illustrates a problem encountered when a pair of plugs connecting lower-layer and upper-layer wires are formed by using the conventional method for fabricating a semiconductor device.

FIG. 11 is different from FIG. 10B illustrating one of the process steps of the conventional method for fabricating a semiconductor device in that an adjacent plug 22 connecting the lower-layer wire 12A and the upper-layer wire 21 (see FIG. 10C) and adjacent to the plug 16 is formed and the air gap 20 is also formed in the space between the plug 16 and the adjacent plug 22 (hereinafter referred to as a plug-to-plug space). As the distance between the plug 16 and the adjacent plug 22 decreases, the aspect ratio of the plug-to-plug space increases so that it becomes difficult to bury the second interlayer insulating film 18 or the third interlayer insulating film 19 in the plug-to-plug space. Consequently, the top portion of the air gap 20 formed in the plug-to-plug space is positioned at a high level. As a result, the air gap 20 has an opening 20a formed in the upper surface of the planarized second interlayer insulating film 18 or third interlayer insulating film 19 in the polishing step performed with respect to the second interlayer insulating film 18 and the third interlayer insulating film 19, as shown in FIG. 11, which raises the possibility that the conductive film serving as the upper-layer wire 21 enters the opening 20a. In this case, a formation defect such as a breakage occurs in the upper-layer wire 21 (see FIG. 10B), a short circuit occurs between the lower-layer wires 12A, or a short circuit occurs between the plug 16 and the adjacent plug 22, so that the reliability of the multilayer wires is reduced.

Since the conventional method for fabricating a semiconductor device performs etching with respect to the first conductive film 12 and the like by using the plug 16 as a mask (see FIG. 9C) or performs polishing with respect to the second interlayer insulating film 18 or the third interlayer insulating film 19 till the plug 16 is exposed (see FIG. 10B), the height of the plug 16 is lowered gradually during the fabrication steps. In order for the final height of the plug 16 to be equal to a specified value, the height of the plug 16 at the time at which the plug 16 is formed in the connection hole 15 provided in the first interlayer insulating film 13 (see FIG. 8C) should have a margin. Specifically, it is necessary to form the connection hole 15 with a high aspect ratio in the first interlayer insulating film 13 and bury the conductive film forming the plug 16 (hereinafter referred to as the conductive film for plug formation) in the connection hole 15.

As the aspect ratio of the connection hole 15 increases, however, it becomes difficult to bury the conductive film for plug formation in the connection hole 15. As a result, as shown in FIG. 12 (corresponding to FIG. 8C), a void 16a may remain in the plug 16 formed in the connection hole 15 and a plug formation defect such as the increased electric resistance of the plug 16 may occur. The plug formation defect is more likely to occur as the plug diameter decreases with the scaling down of the multilayer wires.

The upper portion of the plug 16 is further etched and polished in the etch-back step performed with respect to the first interlayer insulating film 13 (see FIG. 9A), in the etching step performed with respect to the first conductive film 12 and the like (see FIG. 9C), and in the polishing step performed with respect to the third interlayer insulating film 19 (see FIG. 10B) and the like. This raises the possibility that the void 16a within the plug 16 is formed with an opening, as shown in FIG. 13 (corresponding to FIG. 10B). If the void 16a is formed with the opening, the conductive film serving as the upper-layer wire 21 enters the opening to cause a formation defect such as a breakage in the upper-layer wire 21. Alternatively, abrasive grains used in the polishing step performed with respect to the third interlayer insulating film 19 and the like flow into the void 16a, i.e., into the plug 16 and remain there, which causes the problem of the reduced electromigration resistance of the plug 16, i.e., the problem of the reduced reliability of the multilayer wires.

SUMMARY OF THE INVENTION

In view of the foregoing, it is therefore an object of the present invention to provide the multilayer wires reduced in size, while the top portion of the air gap is positioned lower in level than the upper surface of the plug, and to prevent the formation of a void in the plug.

A method for fabricating a semiconductor device according to the present invention comprises the steps of: depositing a first conductive film on a semiconductor substrate; forming a lower interlayer insulating film on the first conductive film and then selectively etching the lower interlayer insulating film to form a first opening reaching the first conductive film; burying a second conductive film in the first opening to form a lower plug connected to the first conductive film; forming a mask pattern on the lower interlayer insulating film and sequentially etching the lower interlayer insulating film and the first conductive film by using the mask pattern and the lower plug as a mask to form a lower-layer wire composed of the first conductive film and connected to the lower plug; forming an upper interlayer insulating film on the semiconductor substrate such that an air gap is formed in a wire-to-wire space of the lower-layer wire; selectively etching the upper interlayer insulating film to form a second opening reaching the lower plug; burying a third conductive film in the second opening to form an upper plug connected to the lower plug; and forming an upper-layer wire on the upper interlayer insulating film such that the upper-layer wire is connected to the upper plug.

The method for fabricating a semiconductor device according to the present invention buries the lower plug in the lower interlayer insulating film formed on the first conductive film on the semiconductor substrate and patterns the first conductive film to form the lower-layer wire by using the mask pattern formed on the lower interlayer insulating film and the lower plug. Thereafter, the upper interlayer insulating film is formed such that the air gap is formed in the wire-to-wire space of the lower-layer wire and then the upper plug connected to the lower plug is formed in the upper interlayer insulating film. This allows the top portion of the air gap to be positioned lower than the upper surface of the upper interlayer insulating film, i.e., the upper surface of the upper plug. Accordingly, it is no more necessary to etch-back the lower interlayer insulating film in which the lower plug has been buried such that the lower plug protrudes and thereby control the position of the top portion of the air gap. Since the mask pattern for forming the lower-layer wire can be formed on the lower interlayer insulating film free of ruggedness, the mask pattern can be reduced in size and the lower-layer wire, i.e., the multilayer wires can be thereby scaled down.

Since the method for fabricating a semiconductor device according to the present invention buries the upper plug composing each of plugs in the upper interlayer insulating film even when the plugs connecting the lower-layer wire and the lower-layer wire are disposed in close proximity, the air gap is not formed in the region between the upper plugs composing the individual plugs. This allows the top portion of the air gap to be positioned lower than the upper surface of the upper plug and prevents the air gap from having an opening formed in the upper surface of the upper interlayer insulating film, thereby preventing a formation defect in the upper-layer wire.

The method for fabricating a semiconductor device according to the present invention also divides each of the plugs connecting the lower-layer wire and the upper-layer wire into the lower plug and the upper plug and forms them by individually burying the conductive films in the different openings, i.e., connection holes. This lowers the aspect ratio of each of the connection holes and allows each of the connection holes to be filled fully with the conductive films, thereby preventing the formation of a void in each of the lower plug and the upper plug. As a result, a plug having a sufficient height can be formed easily, while an increase in the electric resistance of each of the plugs composed of the lower plugs and the upper plugs is prevented. Even if the surface portion of the plug is etched or polished during the fabrication steps, the void within the plug has no opening so that a formation defect such as a breakage in the upper-layer wire or the reduced electromigration resistance of the plug due to abrasive grains that have entered the plug is prevented.

In the method for fabricating a semiconductor device according to the present invention, the step of forming the lower plug preferably includes the step of: planarizing an upper surface of the lower interlayer insulating film such that the upper surface of the lower interlayer insulating film is flush with an upper surface of the lower plug.

This further planarizes the lower interlayer insulating film serving as the underlie for the mask pattern for forming the lower-layer wire so that the mask pattern is further reduced in size and the lower-layer wire, i.e., the multilayer wires are thereby further scaled down.

In the method for fabricating a semiconductor device according to the present invention, an area of the upper surface of the lower plug is preferably larger than an area of a lower surface of the upper plug.

In the arrangement, even if misalignment occurs during the formation of a mask pattern for forming the second opening, i.e., a connection hole for the upper plug, a sufficiently large connection area is provided between the lower plug and the upper plug so that the electric resistance of the whole plug is not increased. Even if misalignment occurs during the formation of the mask pattern and over-etching is performed by using the formed mask pattern, the upper surface of the lower plug functions as an etching stopper so that the connection hole for the upper plug is prevented from reaching the air gap.

In the method for fabricating a semiconductor device according to the present invention, the upper interlayer insulating film preferably has a first insulating film deposited such that the air gap is formed and a second insulating film deposited on the first insulating film.

In the arrangement, a wire-to-wire capacitance can be reduced by using an insulating film which is high in directivity and low in coverage rate as the first insulating film, while using an insulating film which is excellent in burying property as the second insulating film, and thereby increasing the size of the air gap in a narrow wire-to-wire space. Since an air gap having a top portion positioned at a high level is not formed in a wide wire-to-wire space, the situation in which the air gap is formed with an opening in the subsequent polishing step or the like performed with respect to the interlayer insulating film is circumvented so that the reduced reliability of the multilayer wires is thereby prevented.

Specifically, the first insulating film is preferably formed by plasma CVD (chemical vapor deposition) and the second insulating film is formed by high-density plasma CVD using a plasma at a higher density than a plasma used for the plasma CVD.

If the upper interlayer insulating film further has a third insulating film deposited on the second insulating film and having a surface planarized, the upper-layer wire can be formed easily. At this time, a major part of the upper plug may also be covered with the third insulating film.

Further, the second insulating film that has been formed is polished till the lower plug or the first insulating film is exposed, thereby having a surface planarized. This allows the subsequent step of depositing the insulating film or the conductive film to be performed easily.

A semiconductor device according to the present invention comprises: a lower-layer wire formed on a semiconductor substrate and having an air gap in a wire-to-wire space; an upper-layer wire formed on the lower-layer wire with an interlayer insulating film interposed therebetween; and a plug connecting the lower-layer wire and the upper-layer wire, the plug having a lower plug formed on the lower-layer wire and an upper plug formed on the lower plug to be connected to the upper-layer wire.

Since the semiconductor device according to the present invention is formed in accordance with the method for fabricating a semiconductor device according to the present invention, the multilayer wires can be scaled down, while the top portion of the air gap formed in the wire-to-wire space of the lower-layer is positioned such that it is lower in level than the upper surface of the upper plug, and the formation of a void in each of the lower plug and the upper plug can be prevented.

In the semiconductor device according to the present invention, an area of an upper surface of the lower plug is preferably larger than an area of a lower surface of the upper plug.

In the arrangement, even if misalignment occurs during the formation of a mask pattern for forming a connection hole for the upper plug, a sufficiently large connection area is provided between the lower plug and the upper plug so that the electric resistance of the whole plug is not increased. Even if misalignment occurs during the formation of the mask pattern and over-etching is performed by using the formed mask pattern, the upper surface of the lower plug functions as an etching stopper so that the connection hole for the upper plug is prevented from reaching the air gap.

Preferably, the semiconductor device according to the present invention further comprises: an adjacent plug connecting the lower-layer wire and the upper-layer wire and adjacent to the plug, the adjacent plug having a lower adjacent plug formed on the lower-layer wire to be adjacent to the lower plug and an upper adjacent plug formed on the lower adjacent plug to be adjacent to the upper plug.

In the arrangement, even if the plug composed of the lower plug and the upper plug is disposed in close proximity to the adjacent plug composed of the lower adjacent plug and the upper adjacent plug, the air gap is not formed in the region between the upper plug and the upper adjacent plug. This allows the top portion of the air gap to be positioned lower than the upper surface of the upper plug or the upper adjacent plug.

In the semiconductor device according to the present invention, the interlayer insulating film is preferably composed of a lower interlayer insulating film deposited to cover an upper surface of the lower-layer wire and an upper interlayer insulating film deposited on the lower interlayer insulating film and the upper interlayer insulating film preferably has a first insulating film deposited such that the air gap is formed and a second insulating film deposited on the first insulating film.

In the arrangement, a wire-to-wire capacitance can be reduced by using an insulating film which is high in directivity and low in coverage rate as the first insulating film, while using an insulating film which is excellent in burying property as the second insulating film, and thereby increasing the size of the air gap in a narrow wire-to-wire space. Since an air gap having a top portion positioned at a high level is not formed in a wide wire-to-wire space, the situation in which the air gap is formed with an opening in the subsequent polishing step or the like performed with respect to the interlayer insulating film is circumvented so that the reduced reliability of the multilayer wires is thereby prevented.

If the upper interlayer insulating film further has a third insulating film deposited on the second insulating film and having a surface planarized, the upper-layer wire can be formed easily. At this time, a major part of the upper plug may also be covered with the third insulating film.

DETAILED DESCRIPTION OF THE INVENTION

Embodiment 1

A semiconductor device and a method for fabricating the same according to a first embodiment of the present invention will be described with reference to the drawings.

FIGS. 1A to 1D, FIGS. 2A to 2C, and FIGS. 3A to 3C are cross-sectional views illustrating the individual process steps of the method for fabricating a semiconductor device according to the first embodiment.

Figure 1A:
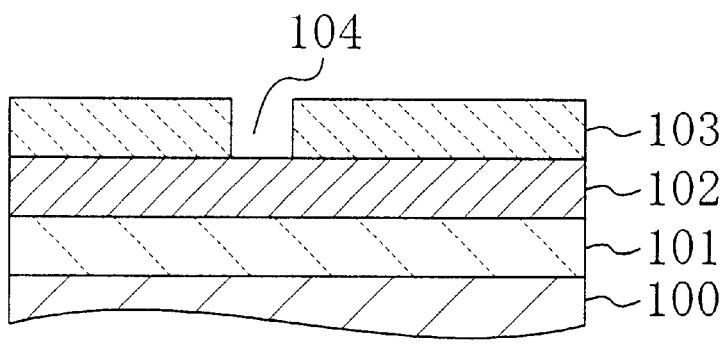
FIGS. 1A to 1D are cross-sectional views illustrating the individual process steps of a method for fabricating a semiconductor device according to a first embodiment of the present invention.

First, as shown in FIG. 1A, an underlying insulating film 101 composed of, e.g., a silicon dioxide and a first conductive film 102 composed of, e.g., an aluminum alloy with a thickness of about 600 nm are deposited successively on a semiconductor substrate 100 composed of, e.g., silicon. Thereafter, a first interlayer insulating film 103 (the lower interlayer insulating film in claims) composed of, e.g., a silicon dioxide with a thickness of about 300 to 600 nm is deposited on the first conductive film 102. Then, a mask pattern (not shown) having an opening corresponding to a region to be formed with a lower plug is formed on the first interlayer insulating film 103. Subsequently, etching is performed with respect to the first interlayer insulating film 103 by using the mask pattern, thereby forming a first connection hole 104 reaching the first conductive film 102 and having a diameter of about 400 nm.

Figure 1B:
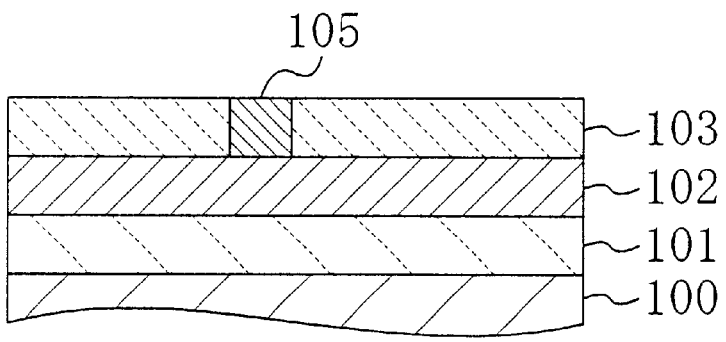

Next, a second conductive film composed of, e.g., tungsten is deposited by, e.g., vapor deposition or the like over the entire surface of the first interlayer insulating film 103 including the first connection hole 104 such that the first connection hole 104 is filled fully with the second conductive film. Then, the portion of the second conductive film located externally of the first connection hole 104 is polished away by CMP, whereby a lower plug 105 connected to the first conductive film 102 is formed, as shown in FIG. 1B. Since the aspect ratio of the first connection hole 104 is relatively low (on the order of, e.g., 1 to 1.5), the first connection hole 104 can be filled fully with the second conductive film so that no void is formed in the lower plug 105. During the formation of the lower plug 105, the upper surface of the first interlayer insulating film 103 is planarized to be flush with the upper surface of the lower plug 105.

Figure 1C:
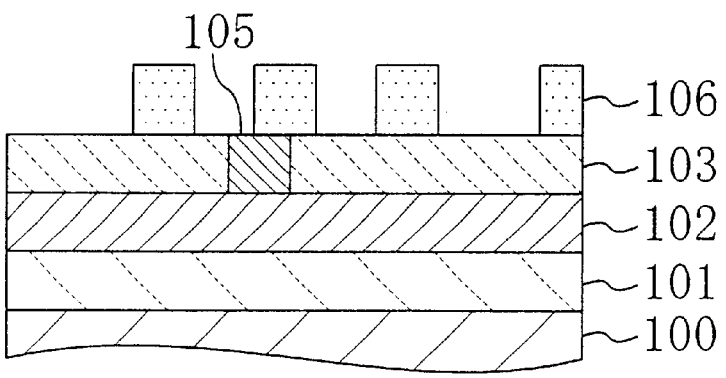

Next, as shown in FIG. 1C, a resist pattern 106 covering a region to be formed with the lower-layer wire is formed on the first interlayer insulating film 103. Since the resist pattern 106 is formed on the underlie free of ruggedness (first interlayer insulating film 103), the resist pattern 106 can be reduced in size.

Figure 1D:
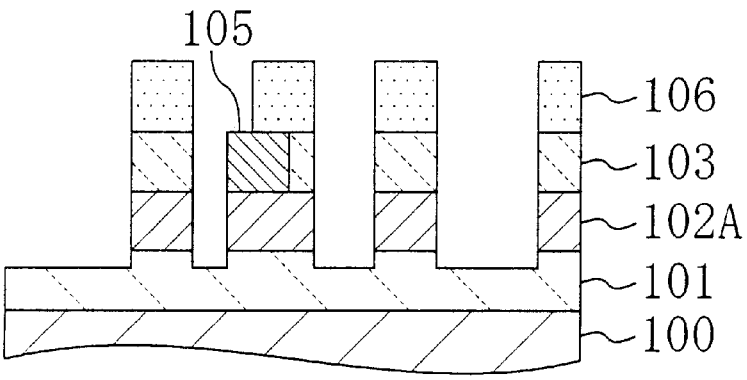

Next, as shown in FIG. 1D, etching is performed sequentially with respect to the first interlayer insulating film 103 and the first conductive film 102 by using the resist pattern 106 and the lower plug 105 as a mask, thereby forming a lower-layer wire 102A composed of the first conductive film 102 and connected to the lower plug 105.

In the step shown in FIG. 1D, etching is also performed with respect to the underlying insulating film 101 by using the resist pattern 106 and the lower plug 105 as a mask after the formation of the lower-layer wire 102A, thereby removing the surface portions of the underlying insulating film 101 located under the wire-to-wire spaces of the lower-layer wire 102A to a depth of, e.g., 300 nm. This allows air gaps 109, which will be formed in the subsequent step (see FIG. 2A), to be formed at lower positions and in opposing relation to the entire side surfaces of the lower-layer wire 102A, so that the wire-to-wire capacitance of the lower-layer wire 102A is further reduced.

Figure 2A:
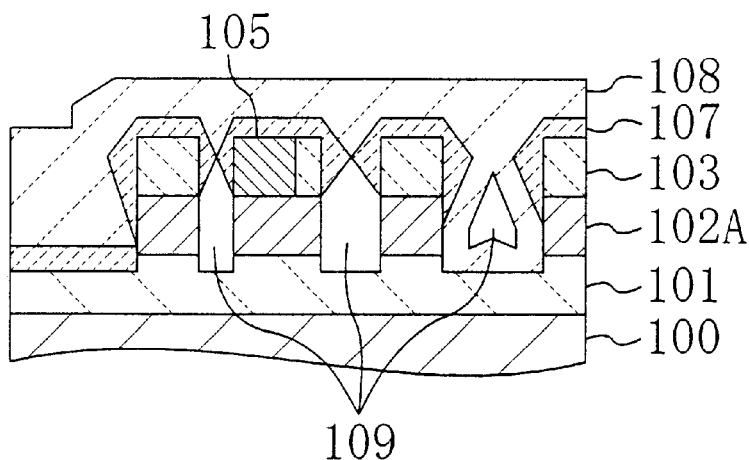
FIGS. 2A to 2C are cross-sectional views illustrating the individual process steps for fabricating the semiconductor device according to the first embodiment.

Next, the resist pattern 106 is removed. Then, as shown in FIG. 2A, a second interlayer insulating film 107 (the first insulating film of the upper interlayer insulating film in claims) composed of, e.g., a silicon dioxide with a thickness of about 200 to 500 nm is deposited over the entire surface of the semiconductor substrate 100 by plasma CVD using, e.g., silane gas and dinitrogen oxide gas. Subsequently, a third interlayer insulating film 108 (the second insulating film of the upper interlayer insulating film in claims) composed of, e.g., a silicon dioxide with a thickness of about 1000 nm is deposited by plasma CVD using a plasma at a higher density than the plasma CVD used to form the second interlayer insulating film 107, e.g., by high-density plasma CVD, whereby the air gaps 109 are formed in the wire-to-wire spaces of the lower-layer wire 102A.

Since the second interlayer insulating film 107 is high in directivity and low in coverage rate, while the third interlayer insulating film 108 is excellent in burying property, the wire-to-wire capacitance can be reduced by increasing the size of the air gap 109 formed in a narrower one of the wire-to-wire spaces of the lower-layer wire 102A, as shown in FIG. 2A. Since the air gap 109 having a top portion positioned at a high level is not formed in a wider one of the wire-to-wire spaces of the lower-layer wire 102A, the situation in which the air gap 109 is formed with an opening in the subsequent polishing step or the like performed with respect to the interlayer insulating film (see FIG. 2B) can be circumvented. This prevents the reduced reliability of the multilayer wires.

Figure 2B:
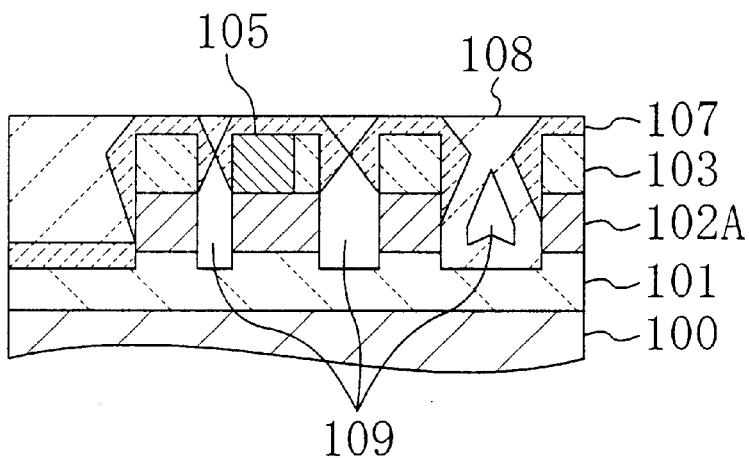

Next, as shown in FIG. 2B, polishing is performed with respect to the second interlayer insulating film 107 and the third interlayer insulating film 108 by CMP, thereby planarizing the respective upper surfaces of the second and third interlayer insulating films 107 and 108. At this time, the upper surface of the third interlayer insulating film 108 may also be planarized to be flush with the upper surface of the second interlayer insulating film 107 by polishing the third interlayer insulating film 108 till the second interlayer insulating film 107 is exposed. Alternatively, the respective upper surfaces of the second and third interlayer insulating films 107 and 108 may also be planarized to be flush with the upper surface of the lower plug 105 by polishing the second and third interlayer insulating films 107 and 108 till the lower plug 105 is exposed.

Figure 2C:
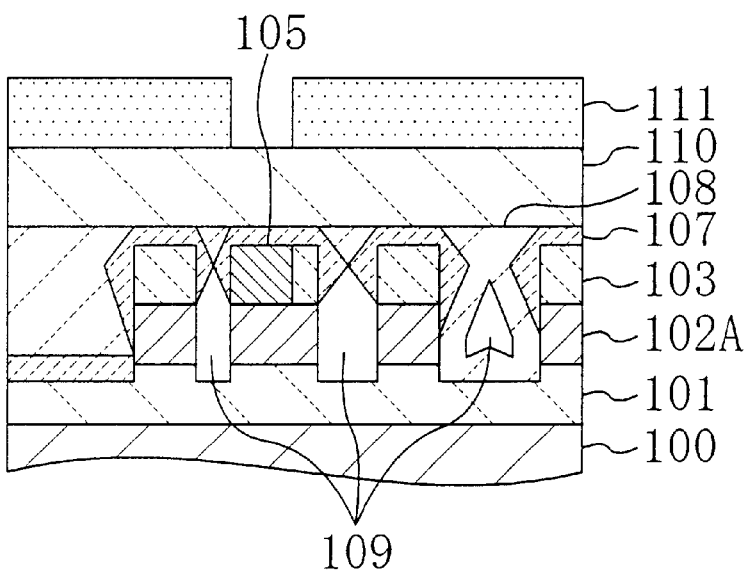

Next, as shown in FIG. 2C, a fourth interlayer insulating film 110 (the third insulating film of the upper interlayer insulating film in claims) composed of, e.g., a silicon dioxide with a thickness of about 400 to 800 nm is deposited entirely over the planarized second and third interlayer insulating films 107 and 108. Then, the surface of the fourth interlayer insulating film 110 is planarized and a mask pattern 111 having an opening corresponding to a region to be formed with an upper plug is formed on the planarized fourth interlayer insulating film 110.

Figure 3A:
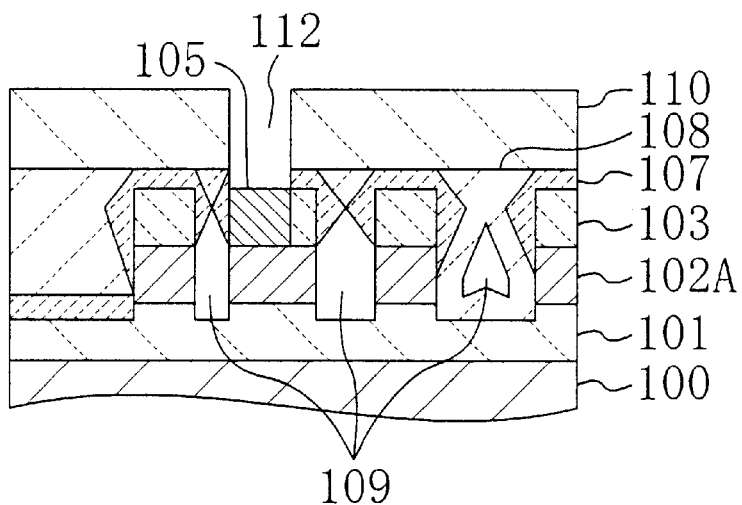
FIGS. 3A to 3C are cross-sectional views illustrating the individual process steps for fabricating the semiconductor device according to the first embodiment.

Next, etching is performed with respect to at least the fourth interlayer insulating film 110 by using the mask pattern 111, thereby forming a second connection hole 112 reaching the lower plug 105 and having a diameter of about 400 nm, as shown in FIG. 3A.

Figure 3B:
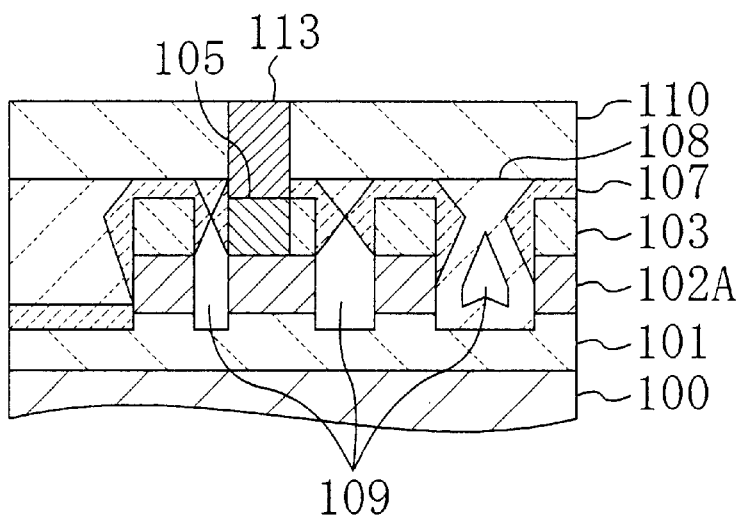

Next, a third conductive film composed of, e.g., tungsten is deposited by, e.g., vapor deposition or the like over the entire surface of the fourth interlayer insulating film 110 including the second connection hole 112 such that the second connection hole 112 is filled fully with the third conductive film. Then, the portion of the third conductive film located externally of the second connection hole 112 is polished away by CMP, whereby an upper plug 113 connected to the lower plug 105 is formed, as shown in FIG. 3B. Since the aspect ratio of the second connection hole 112 is relatively low (on the order of, e.g., 1 to 2), the second connection hole 112 is filled fully with the third conductive film so that no void is formed in the upper plug 113. The lower plug 105 and the upper plug 113 are electrically connected to each other by a direct connection provided therebetween.

Figure 3C:
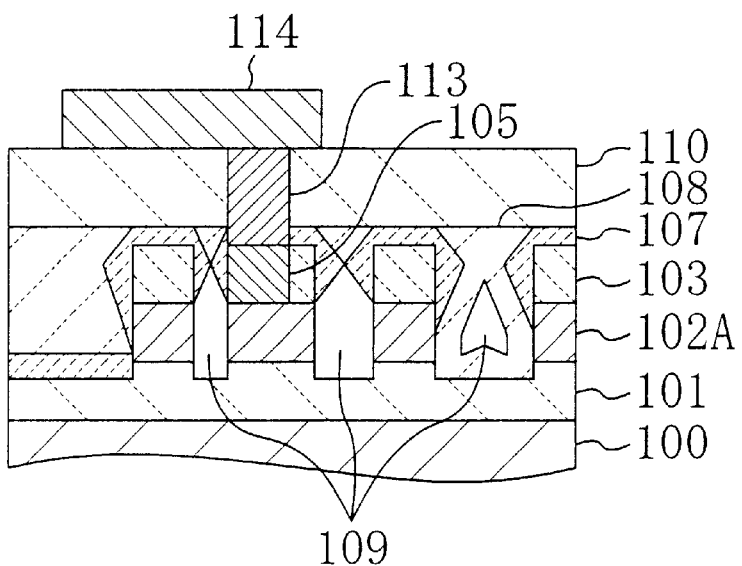

Next, as shown in FIG. 3C, an upper-layer wire 114 is formed on the fourth interlayer insulating film 110 to be connected to the upper plug 113, whereby a two-layer wire structure is completed.

Thus, according to the first embodiment, the lower plug 105 is buried in the first interlayer insulating film 103 formed on the first conductive film 102 on the semiconductor substrate 100 and then the lower-layer wire 102A is formed by patterning the first conductive film 102 by using the resist pattern 106 formed on the first interlayer insulating film 103 and the lower plug 105. Then, the second interlayer insulating film 107 and the third interlayer insulating film 108 are deposited successively such that the air gaps 109 are formed in the wire-to-wire spaces of the lower-layer wire 102A. Thereafter, the fourth interlayer insulating film 110 is further deposited and the upper plug 113 connected to the lower plug 105 is formed in at least the fourth interlayer insulating film 110. This allows the top portion of each of the air gaps 109 to be positioned lower in level than the upper surface of the fourth interlayer insulating film 110, i.e., the upper surface of the upper plug 113. Accordingly, it is no more necessary to etch-back the first interlayer insulating film 103 in which the lower plug 105 is buried such that the lower plug 105 protrudes and thereby control the position of the top portion of each of the air gaps 109. Since the resist pattern 106 for forming the lower-layer wire can be formed on the first interlayer insulating film 103 free of ruggedness (see FIG. 1C), the resist pattern 106 can be reduced in size and therefore the lower-layer wire 102A, i.e., the multilayer wires can be scaled down.

According to the first embodiment, the plug connecting the lower-layer wire 102A and the upper-layer wire 114 is divided into the lower plug 105 and the upper plug 113, which are formed by individually burying the conductive films in the different connection holes, specifically the first and second connection holes 104 and 112. This lowers the aspect ratio of each of the connection holes and allows the conductive films to be buried satisfactorily in the individual connection holes, thereby preventing the formation of a void in each of the lower plug 105 and the upper plug 113. As a result, a plug having a sufficient height can be implemented easily, while an increase in the electric resistance of the plug composed of the lower and upper plugs 105 and 113 is prevented. Even if the surface portion of the plug is etched or polished during the fabrication steps, the void within the plug is no more formed with an opening so that a formation defect such as a breakage in the upper-layer wire 114 or the reduced electromigration resistance of the plug due to abrasive grains that have entered the plug is prevented.

According to the first embodiment, the upper surface of the first interlayer insulating film 103 is planarized to be flush with the upper surface of the lower plug 105 when the lower plug 105 is buried in the first connection hole 104 formed in the first interlayer insulating film 103. Accordingly, the first interlayer insulating film 103 serving as the underlie for the resist pattern 106 for forming the lower-layer wire is further planarized so that the resist pattern 106 is further reduced in size and therefore the lower-layer wire 102A, i.e., the multilayer wires are further scaled down.

Although the first embodiment has assumed the two-layer wire structure composed of the lower-layer wire 102A and the upper-layer wire 114, the present invention is not limited thereto. Even in a wire structure consisting of three or more layers, the same effects as achieved by the first embodiment are achievable by repeatedly performing the step of dividing the plug connecting vertically adjacent wires into lower and upper parts and forming the lower and upper plugs by individually burying conductive films in different connection holes.

Although the first embodiment has formed the plug connecting the lower-layer wire 102A and the upper-layer wire 114 by dividing the plug into two parts and forming the lower plug 105 and the upper plug 113 by individually burying the conductive films in the different connection holes, the present invention is not limited thereto. The same effects as achieved by the first embodiment are achievable by dividing the plug connecting vertically adjacent wires into three or more parts and forming each of the parts of the plug by individually burying conductive films in different connection holes.

Although the first embodiment has used the resist pattern 106 as a mask even in the etching step performed with respect to the first conductive film 102 or the underlying insulating film 101 when etching is performed sequentially with respect to the first interlayer insulating film 103, the first conductive film 102, and the underlying insulating film 101 (see FIG. 1D), the patterned first interlayer insulating film 103 may also be used instead as a mask in the etching step performed with respect to the first conductive film 102 or the underlying insulating film 101. In this case, the first interlayer insulating film 103 is preferably deposited relatively thick in the step shown in FIG. 1A.

Although the first embodiment has formed the second interlayer insulating film 107, the third interlayer insulating film 108, and the fourth interlayer insulating film 110 between the formation of the lower-layer wire 102A and the formation of the upper-layer wire 114, the number and types of interlayer insulating films (upper interlayer insulating films) formed between the formation of the lower-layer wire 102A and the formation of the upper-layer wire 114 or deposition methods therefor are not particularly limited.

Variation of Embodiment 1

A semiconductor device according to a variation of the first embodiment and a method for fabricating the same will be described with reference to the drawings.

Figure 4:
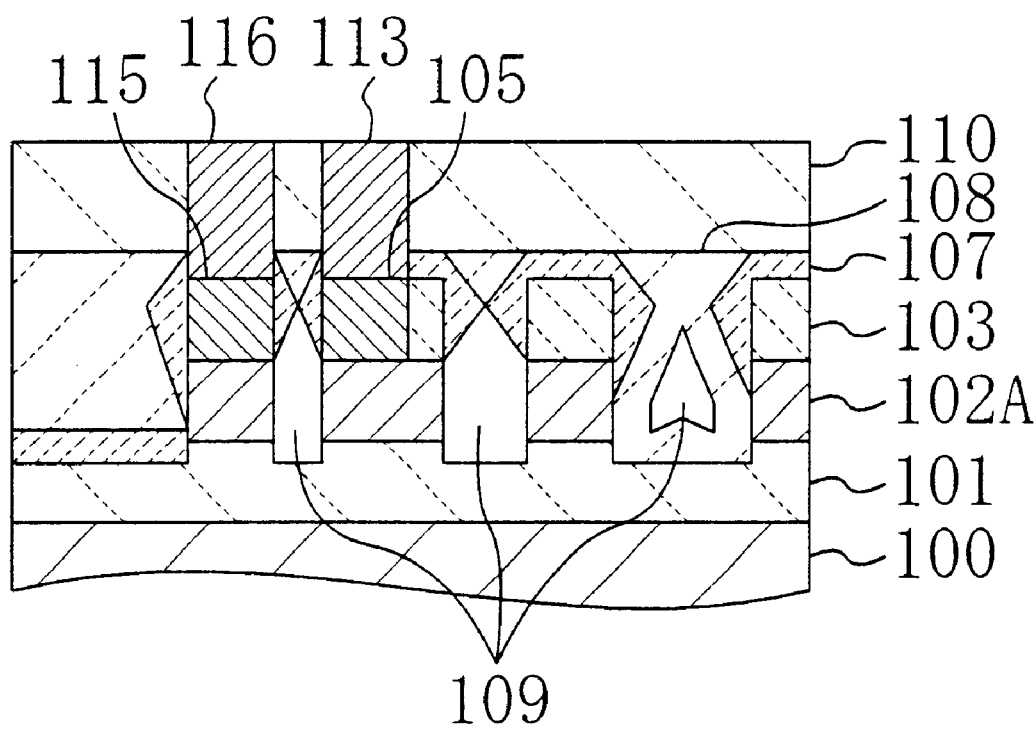
FIG. 4 is a cross-sectional view showing one of the process steps of a method for fabricating a semiconductor device according to a variation of the first embodiment.

FIG. 4 is a cross-sectional view showing one of the process step of the method for fabricating a semiconductor device according to the variation. It is to be noted that FIG. 4 corresponds to FIG. 3B showing one of the process steps of the method for fabricating a semiconductor device according to the first embodiment.

The variation of the first embodiment is different from the first embodiment in that a lower adjacent plug 115 is formed on the lower-layer wire 102A to be adjacent to the lower plug 105 and an upper adjacent plug 116 is formed on the lower adjacent plug 115 to be adjacent to the upper plug 113, as shown in FIG. 4. The lower adjacent plug 115 is formed by the same method as used to form the lower plug 105 (see FIGS. 1A and 1B), while the upper adjacent plug 116 is formed by the same method as used to form the upper plug 113 (see FIG. 2C and FIGS. 3A and 3B).

The variation of the first embodiment achieves the following effects in addition to the effects achieved by the first embodiment.

Even if one plug composed of the lower plug 105 and the upper plug 113 and another plug composed of the lower adjacent plug 115 and the upper adjacent plug 116 are disposed in close proximity, each of the upper plug 113 and the upper adjacent plug 116 is buried in at least the fourth interlayer insulating film 110 so that the air gap 109 is not formed in the region between the upper plug 113 and the upper adjacent plug 116. As a result, the top portion of each of the air gaps 109 can be positioned lower than the upper surface of the upper plug 113 or of the upper adjacent plug 116. This prevents the air gap 109 from having an opening formed in the upper surface of the fourth interlayer insulating film 110 and thereby prevents a formation defect in the upper-layer wire 114.

Embodiment 2

A semiconductor device and a method for fabricating the same according to a second embodiment of the present invention will be described with reference to the drawings.

FIGS. 5A to 5D, FIGS. 6A to 6C, and FIGS. 7A to 7C are cross-sectional views illustrating the individual process steps of the method for fabricating a semiconductor device according to the second embodiment.

Figure 5A:
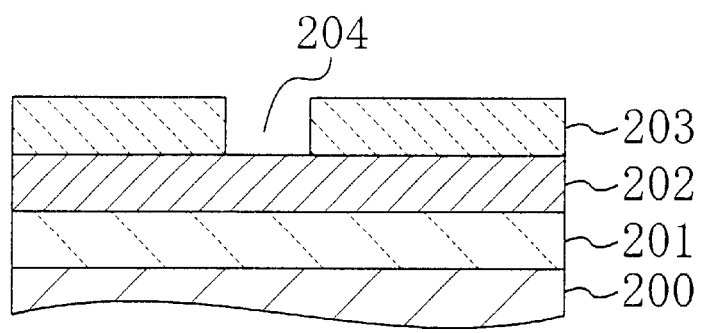
FIGS. 5A to 5D are cross-sectional views illustrating the individual process steps of a method for fabricating a semiconductor device according to a second embodiment of the present invention.

First, as shown in FIG. 5A, an underlying insulating film 201 composed of, e.g., a silicon dioxide and a first conductive film 202 composed of, e.g., an aluminum alloy with a thickness of about 600 nm are deposited successively on a semiconductor substrate 200 composed of, e.g., silicon. Thereafter, a first interlayer insulating film 203 (the lower interlayer insulating film in claims) composed of, e.g., a silicon dioxide with a thickness of about 300 to 600 nm is deposited on the first conductive film 202. Then, a mask pattern (not shown) having an opening corresponding to a region to be formed with a lower plug is formed on the first interlayer insulating film 203. Subsequently, etching is performed with respect to the first interlayer insulating film 203 by using the mask pattern, thereby forming a first connection hole 204 reaching the first conductive film 202 and having a diameter of about 500 nm.

Figure 5B:
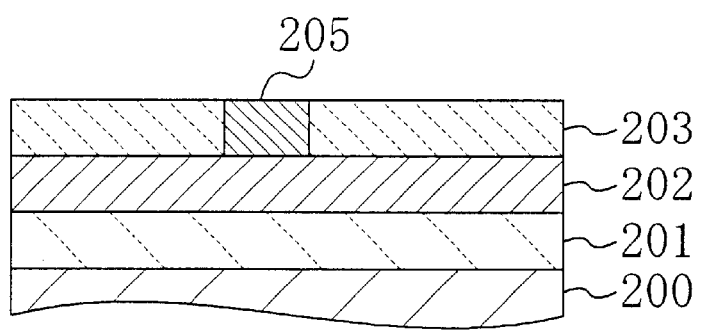

Next, a second conductive film composed of, e.g., tungsten is deposited by, e.g., vapor deposition or the like over the entire surface of the first interlayer insulating film 203 including the first connection hole 204 such that the first connection hole 204 is filled fully with the second conductive film. Then, the portion of the second conductive film located externally of the first connection hole 204 is polished away by CMP, whereby a lower plug 205 connected to the first conductive film 202 is formed, as shown in FIG. 5B. Since the aspect ratio of the first connection hole 204 is relatively low (on the order of 0.6 to 1.2), the first connection hole 204 can be filled fully with the second conductive film so that no void is formed in the lower plug 205. During the formation of the lower plug 205, the area of the upper surface of the lower plug 205 is adjusted to be larger than the area of the lower surface of an upper plug 213, which will be formed in the subsequent step (see FIG. 7B). In addition, the upper surface of the first interlayer insulating film 203 is also planarized to be flush with the upper surface of the lower plug 205.

Figure 5C:
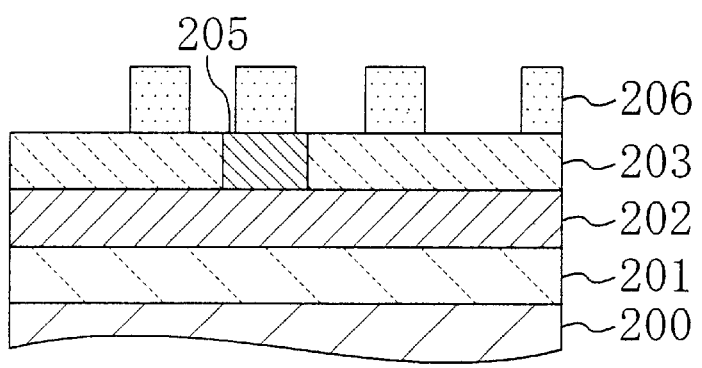

Next, as shown in FIG. 5C, a resist pattern 206 covering a region to be formed with the lower-layer wire is formed on the first interlayer insulating film 203. Since the resist pattern 206 is formed on the underlie free of ruggedness (first interlayer insulating film 203), the resist pattern 206 can be reduced in size.

Figure 5D:
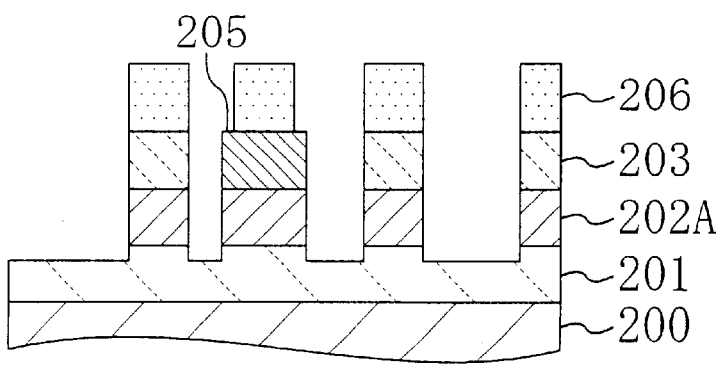

Next, as shown in FIG. 5D, etching is performed successively with respect to the first interlayer insulating film 203 and the first conductive film 202 by using the resist pattern 206 and the lower plug 205 as a mask, thereby forming a lower-layer wire 202A composed of the first conductive film 202 and connected to the lower plug 205.

In the step shown in FIG. 5D, etching is also performed with respect to the underlying insulating film 201 by using the resist pattern 206 and the lower plug 205 as a mask after the formation of the lower-layer wire 202A, thereby removing the surface portions of the underlying insulating film 201 located under the wire-to-wire spaces of the lower-layer wire 202A to a depth of, e.g., 300 nm. This allows air gaps 209, which will be formed in the subsequent step (see FIG. 6A), to be formed at lower positions and in opposing relation to the entire side surfaces of the lower-layer wire 202A, so that the wire-to-wire capacitance of the lower-layer wire 202A is further reduced.

Figure 6A:
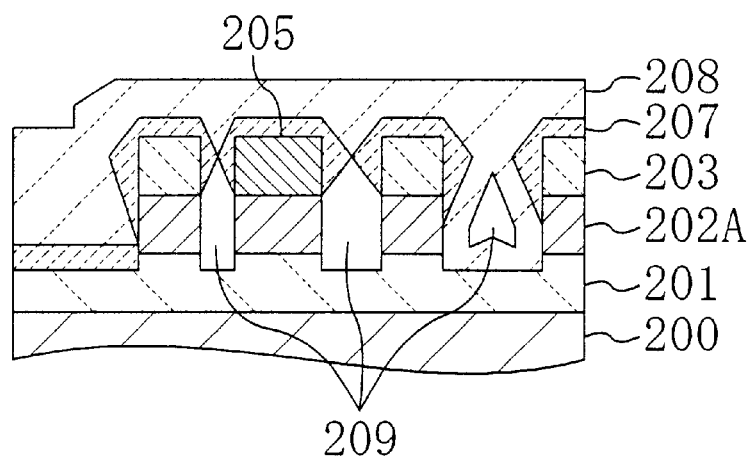
FIGS. 6A to 6C are cross-sectional views illustrating the individual process steps of the method for fabricating the semiconductor device according to the second embodiment.

Next, the resist pattern 206 is removed. Then, as shown in FIG. 6A, a second interlayer insulating film 207 (the first insulating film of the upper interlayer insulating film in claims) composed of, e.g., a silicon dioxide with a thickness of about 200 to 500 nm is deposited over the entire surface of the semiconductor substrate 200 by plasma CVD using, e.g., silane gas and dinitrogen oxide gas. Subsequently, a third interlayer insulating film 208 (the second insulating film of the upper interlayer insulating film in claims) composed of, e.g., a silicon dioxide with a thickness of about 1000 nm is deposited by plasma CVD using a plasma at a higher density than the plasma CVD used to form the second interlayer insulating film 207, e.g., by high-density plasma CVD, whereby the air gaps 209 are formed in the wire-to-wire spaces of the lower-layer wire 202A.

Since the second interlayer insulating film 207 is high in directivity and low in coverage rate, while the third interlayer insulating film 208 is excellent in burying property, the wire-to-wire capacitance can be reduced by increasing the size of the air gap 209 formed in a narrower one of the wire-to-wire spaces of the lower-layer wire 202A, as shown in FIG. 6A. Since the air gap 209 having a top portion positioned at a high level is not formed in a wider one of the wire-to-wire spaces of the lower-layer wire 202A, the situation in which the air gap 209 is formed with an opening in the subsequent polishing step or the like performed with respect to the interlayer insulating film (see FIG. 6B) can be circumvented. This prevents the reduced reliability of the multilayer wires.

Figure 6B:
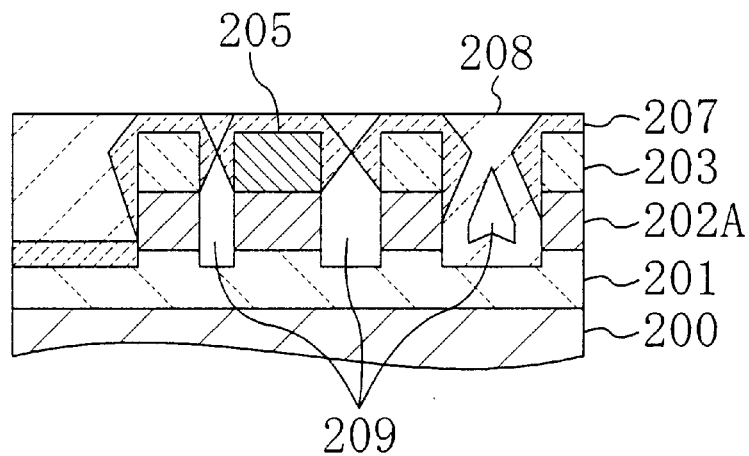

Next, as shown in FIG. 6B, polishing is performed with respect to the second interlayer insulating film 207 and the third interlayer insulating film 208 by CMP, thereby planarizing the respective upper surfaces of the second and third interlayer insulating films 207 and 208. At this time, the upper surface of the third interlayer insulating film 208 may also be planarized to be flush with the upper surface of the second interlayer insulating film 207 by polishing the third interlayer insulating film 208 till the second interlayer insulating film 207 is exposed. Alternatively, the respective upper surfaces of the second and third interlayer insulating films 207 and 208 may also be planarized to be flush with the upper surface of the lower plug 205 by polishing the second and third interlayer insulating films 207 and 208 till the lower plug 205 is exposed.

Figure 6C:
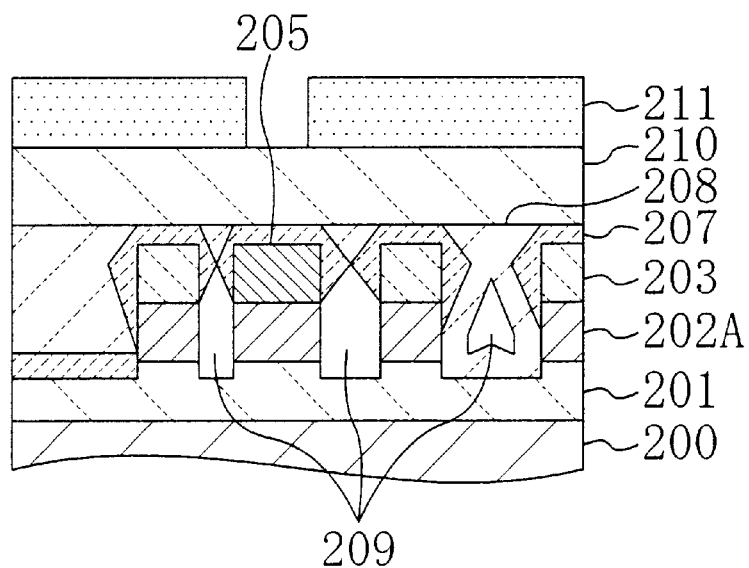

Next, as shown in FIG. 6C, a fourth interlayer insulating film 210 (the third insulating film of the upper interlayer insulating film in claims) composed of, e.g., a silicon dioxide with a thickness of about 400 to 800 nm is deposited entirely over the planarized second and third interlayer insulating films 207 and 208. Then, the surface of a fourth interlayer insulating film 210 is planarized and a mask pattern 211 having an opening corresponding to a region to be formed with an upper plug is formed on the planarized fourth interlayer insulating film 210.

Figure 7A:
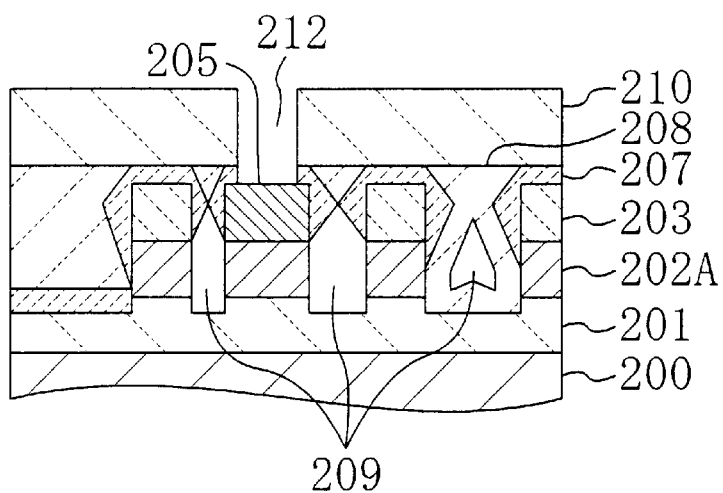
FIGS. 7A to 7C are cross-sectional views illustrating the individual process steps of the method for fabricating the semiconductor device according to the second embodiment.

Next, etching is performed with respect to at least the fourth interlayer insulating film 210 by using the mask pattern 211, thereby forming a second connection hole 212 reaching the lower plug 205 and having a diameter of about 350 nm, as shown in FIG. 7A.

Figure 7B:
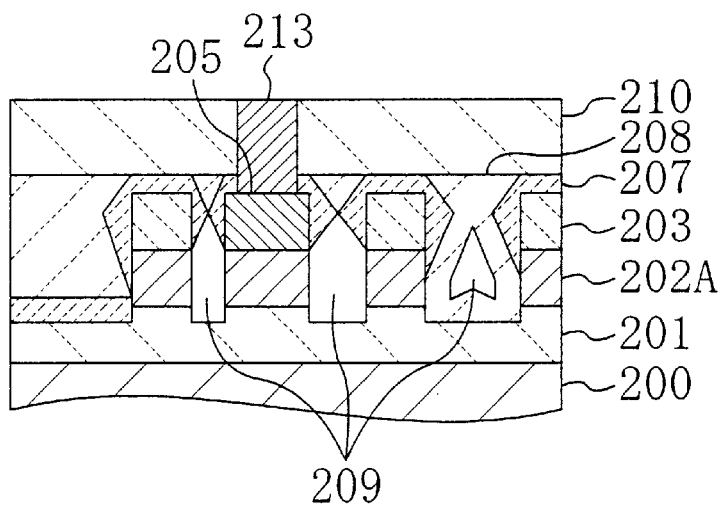

Next, a third conductive film composed of, e.g., tungsten is deposited by, e.g., vapor deposition or the like on the entire surface of the fourth interlayer insulating film 210 including the second connection hole 212 such that the second connection hole 212 is filled fully with the third conductive film. Then, the portion of the third conductive film located externally of the second connection hole 212 is polished away by CMP, whereby an upper plug 213 connected to the lower plug 205 is formed, as shown in FIG. 7B. Since the aspect ratio of the second connection hole 212 is relatively low (on the order of 1.0 to 2.5), the second connection hole 212 can be filled fully with the third conductive film so that no void is not formed in the upper plug 213. The lower plug 205 and the upper plug 213 are electrically connected to each other by a direct connection provided therebetween. The area of the lower surface of the upper plug 213 is smaller than the upper surface of the lower plug 205.

Figure 7C:
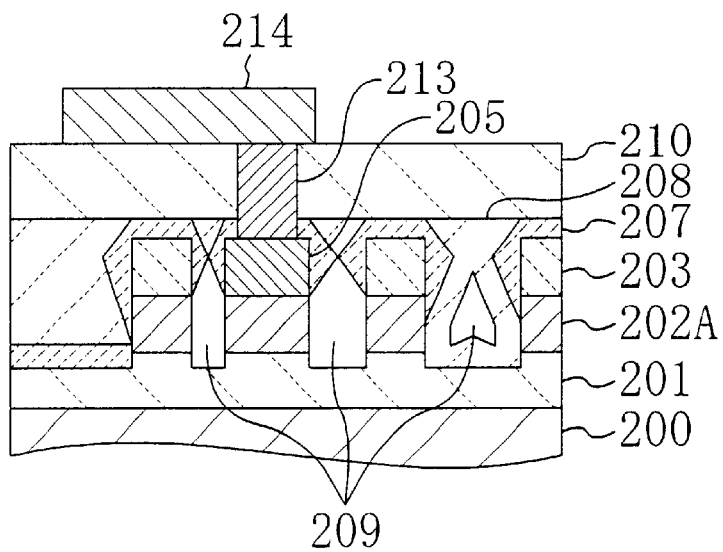
Figure 8A:
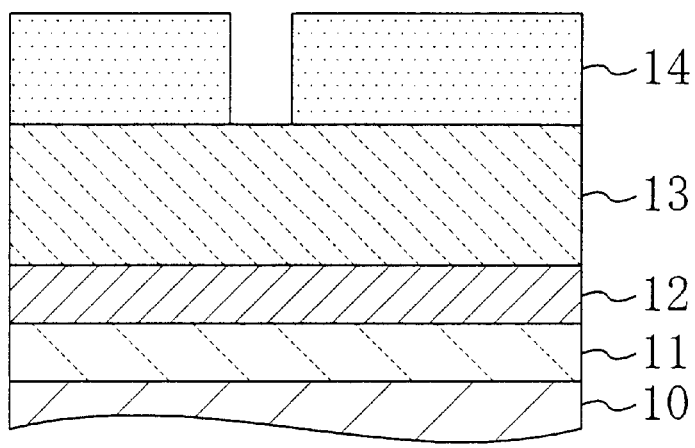
FIGS. 8A to 8C are cross-sectional views illustrating the individual process steps of a conventional method for fabricating a semiconductor device.
Figure 8B:
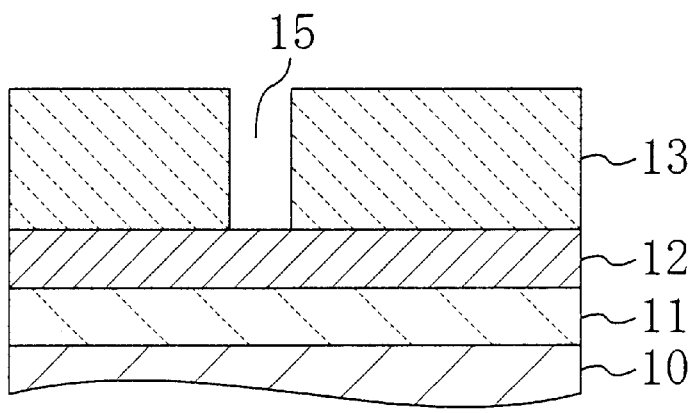
Figure 8C:
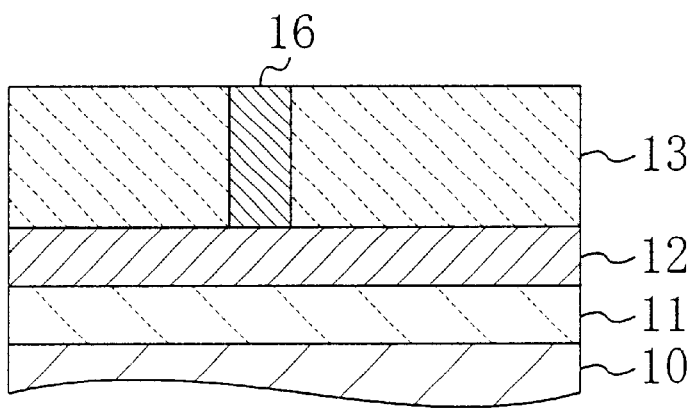
Figure 9A:
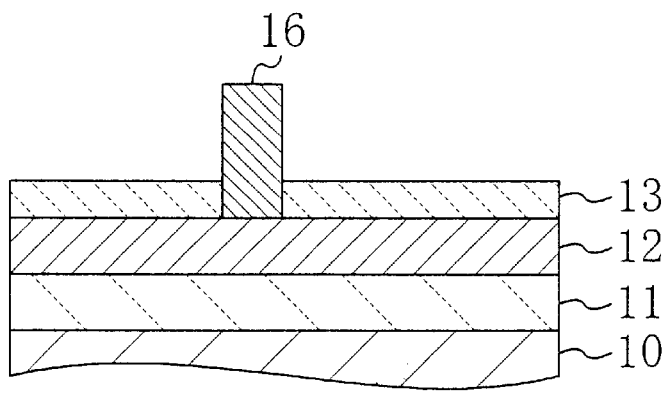
FIGS. 9A to 9C are cross-sectional views illustrating the individual process steps of the conventional method for fabricating a semiconductor device.
Figure 9B:
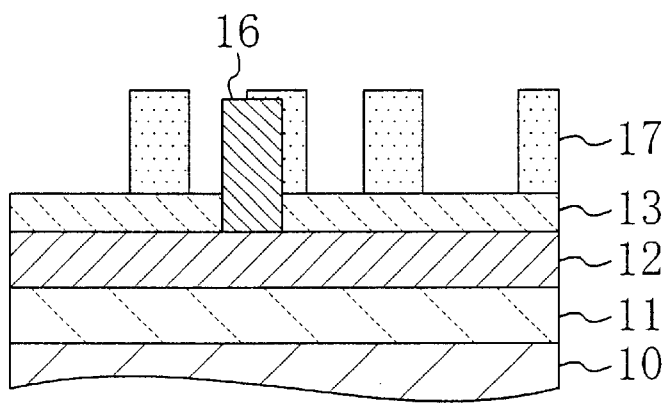
Figure 9C:
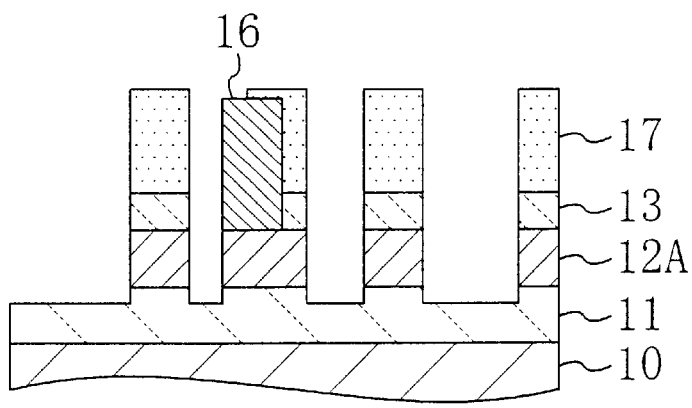
Figure 10A:
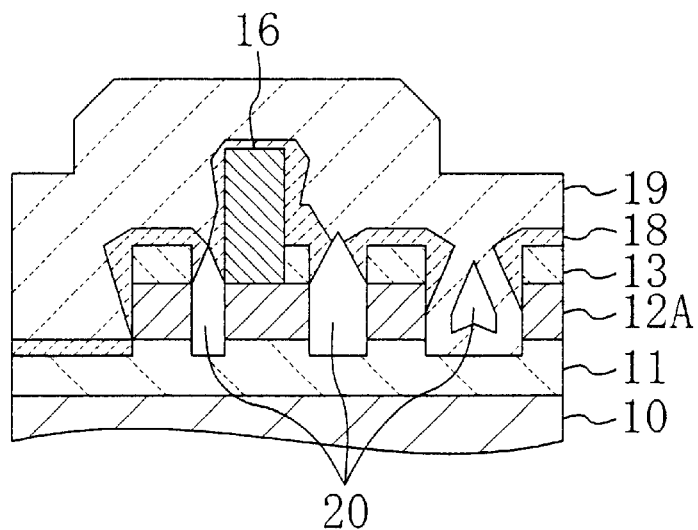
FIGS. 10A to 10C are cross-sectional views illustrating the individual process steps of the conventional method for fabricating a semiconductor device.
Figure 10B:
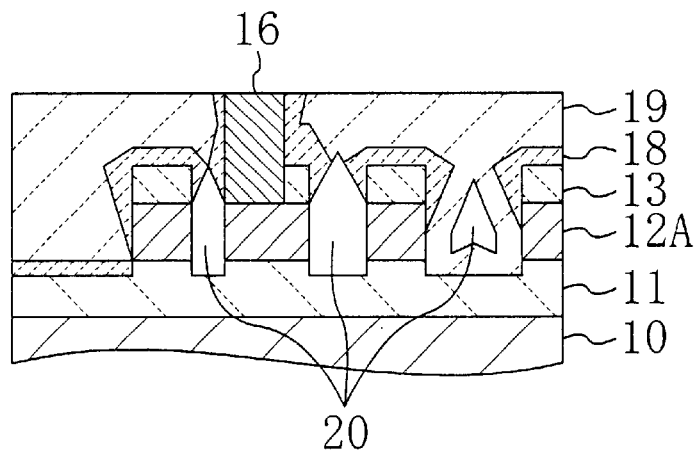
Figure 10C:
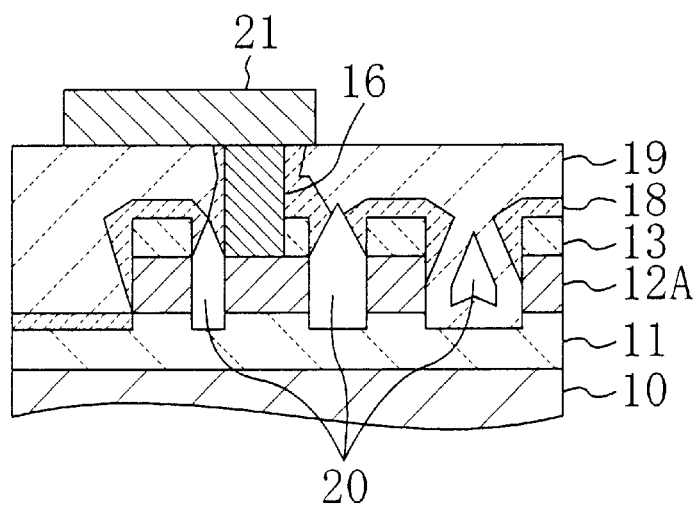
Figure 11:
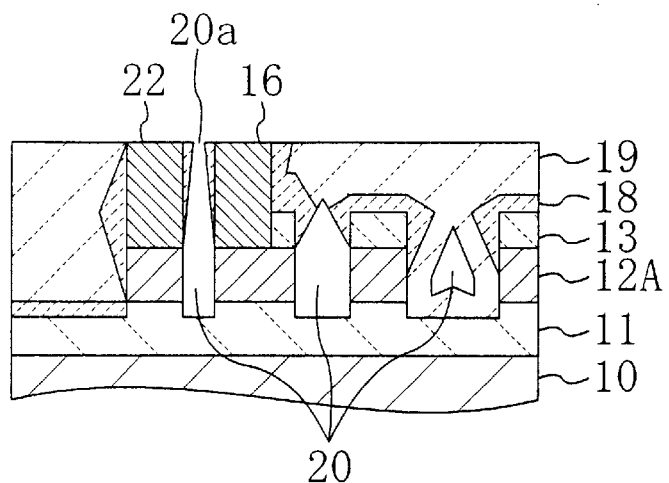
FIG. 11 illustrates a problem encountered when a pair of plugs for connecting lower-layer and upper-layer wires are formed by using the conventional method for fabricating a semiconductor device.
Figure 12:
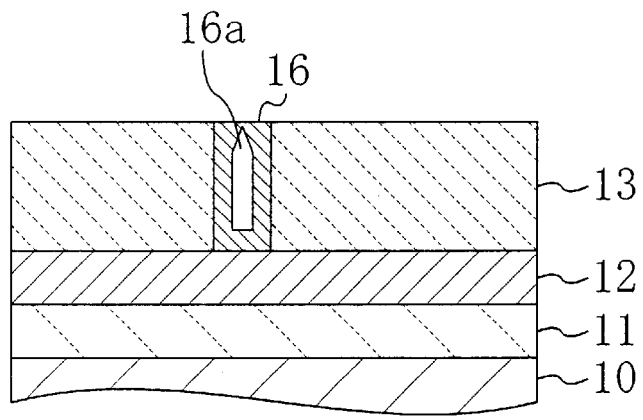
FIG. 12 illustrates a problem encountered when the conventional method for fabricating a semiconductor device is used.
Figure 13:
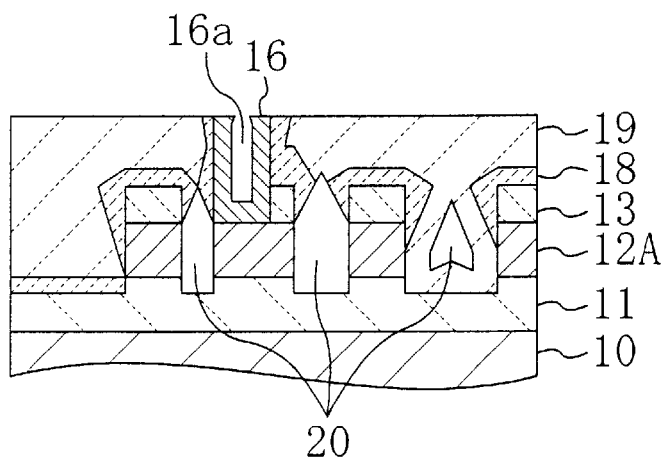
FIG. 13 illustrates the problem encountered when the conventional method for fabricating a semiconductor device is used.

Next, as shown in FIG. 7C, an upper-layer wire 214 is formed on the fourth interlayer insulating film 210 to be connected to the upper plug 213, whereby a two-layer wire structure is completed.

Thus, according to the second embodiment, the lower plug 205 is buried in the first interlayer insulating film 203 formed on the first conductive film 202 on the semiconductor substrate 200 and then the lower-layer wire 202A is formed by patterning the first conductive film 202 by using the resist pattern 206 formed on the first interlayer insulating film 203 and the lower plug 205. Then, the second interlayer insulating film 207 and the third interlayer insulating film 208 are deposited successively such that the air gaps 209 are formed in the wire-to-wire spaces of the lower-layer wire 202A. Thereafter, the fourth interlayer insulating film 210 is further deposited and the upper plug 213 connected to the lower plug 205 is formed in at least the fourth interlayer insulating film 210. This allows the top portion of each of the air gaps 209 to be positioned lower in level than the upper surface of the fourth interlayer insulating film 210, i.e., the upper surface of the upper plug 213. Accordingly, it is no more necessary to etch-back the first interlayer insulating film 203 in which the lower plug 205 is buried such that the lower plug 205 protrudes and thereby control the position of the top portion of each of the air gaps 209. Since the resist pattern 206 for forming the lower-layer wire can be formed on the first interlayer insulating film 203 free of ruggedness (see FIG. 5C), the resist pattern 206 can be reduced in size and therefore the lower-layer wire 202A, i.e., the multilayer wires can be scaled down.

According to the second embodiment, the plug connecting the lower-layer wire 202A and the upper-layer wire 214 is divided into the lower plug 205 and the upper plug 213, which are formed by individually burying the conductive films in the different connection holes, specifically the first and second connection holes 204 and 212. This lowers the aspect ratio of each of the connection holes and allows the conductive films to be buried satisfactorily in the individual connection holes, thereby preventing the formation of a void in each of the lower plug 205 and the upper plug 213. As a result, a plug having a sufficient height can be implemented easily, while an increase in the electric resistance of the plug composed of the lower and upper plugs 205 and 213 is prevented. Even if the surface portion of the plug is etched or polished during the fabrication steps, the void within the plug is not more formed with an opening so that a formation defect such as a breakage in the upper-layer wire 214 or the reduced electromigration resistance of the plug due to abrasive grains that have entered the plug is prevented.

According to the second embodiment, the upper surface of the first interlayer insulating film 203 is planarized to be flush with the upper surface of the lower plug 205 when the lower plug 205 is buried in the first connection hole 204 formed in the first interlayer insulating film 203. Accordingly, the first interlayer insulating film 203 serving as the underlie for the resist pattern 206 for forming the lower-layer wire is further planarized so that the resist pattern 206 is further reduced in size and therefore the lower-layer wire 202A, i.e., the multilayer wires are further scaled down.

Since the second embodiment has adjusted the area of the upper surface of the lower plug 205 such that it is larger than the area of the lower surf ace of the upper plug 213, a sufficiently large connection area is provided between the lower plug 205 and the upper plug 213 even if misalignment occurs during the formation of the mask pattern 211 for forming the second connection hole 212 for the upper plug 213. Consequently, the electric resistance of the whole plug is not increased. Even if misalignment occurs during the formation of the mask pattern 211 and over-etching is performed by using the formed mask pattern 211, the upper surface of the lower plug 205 functions as an etching stopper so that the second connection hole 212 is prevented from reaching the air gap 209.

Although the second embodiment has assumed the two-layer wire structure composed of the lower-layer wire 202A and the upper-layer wire 214, the present invention is not limited thereto. Even in a wire structure consisting of three or more layers, the same effects as achieved by the second embodiment are achievable by repeatedly performing the step of dividing the plug connecting vertically adjacent wires into lower and upper parts and forming the lower and upper plugs by individually burying conductive films in different connection holes.

Although the second embodiment has formed the plug connecting the lower-layer wire 202A and the upper-layer wire 214 by dividing the plug into two parts and forming the lower plug 205 and the upper plug 213 by individually burying the conductive films in the different connection holes, the present invention is not limited thereto. The same effects as achieved by the second embodiment are achievable by dividing the plug connecting vertically adjacent wires into three or more parts and forming each of the parts of the plug by individually burying the conductive films in different connection holes.

Although the second embodiment has used the resist pattern 206 as a mask even in the etching step performed with respect to the first conductive film 202 or the underlying insulating film 201 when etching is performed sequentially with respect to the first interlayer insulating film 203, the first conductive film 202, and the underlying insulating film 201 (see FIG. 5D), the patterned first interlayer insulating film 203 may also be used instead as a mask in the etching step performed with respect to the first conductive film 202 or the underlying insulating film 201. In this case, the first interlayer insulating film 203 is preferably deposited relatively thick in the step shown in FIG. 5A.

Although the second embodiment has formed the second interlayer insulating film 207, the third interlayer insulating film 208, and the fourth interlayer insulating film 210 between the formation of the lower-layer wire 202A and the formation of the upper-layer wire 214, the number and types of interlayer insulating films (upper interlayer insulating films) formed between the formation of the lower-layer wire 202A and the formation of the upper-layer wire 214 or deposition methods therefor are not particularly limited.

Although the second embodiment has adjusted the area of the upper surface of the lower plug 205 such that it is larger than the area of the lower surface of the upper plug 213, it is also possible to adjust the area of the lower surface of the upper plug 213 such that it is larger than the area of the upper surface of the lower plug 205. In this case, even if misalignment occurs during the formation of the mask pattern 211, a sufficiently larger connection area is provided between the lower plug 205 and the upper plug 213, so that the electric resistance of the whole plug is not increased.

In the second embodiment, it is also possible to form a lower adjacent plug on the lower-layer wire 202A such that the lower adjacent plug is adjacent to the lower plug 205 by using the same method as used to form the lower plug 205 (see FIGS. 5A and 5B) and form an upper adjacent plug on the lower adjacent plug such that the upper adjacent plug is adjacent to the upper plug 213 by using the same method as used to form the upper plug 213 (see FIGS. 6C, 7A, and 7B). In the arrangement, even if one plug composed of the lower plug 205 and the upper plug 213 is disposed in close proximity to another plug composed of the lower adjacent plug and the upper adjacent plug, the upper plug 213 and the upper adjacent plug are buried in at least the fourth interlayer insulating film 210, so that the air gap 209 is not formed in the region between the upper plug 213 and the upper adjacent plug. This allows the top portion of the air gap 209 to be positioned lower than the upper surface of the upper plug 213 or the upper adjacent plug and prevents the air gap

209 from having an opening formed in the upper surface of the fourth interlayer insulating film 210, thereby preventing a formation defect in the upper-layer wire 214. In the case of forming the lower adjacent plug and the upper adjacent plug, it is preferred to adjust the area of the upper surface of the lower adjacent plug such that it is larger than the area of the lower surface of the upper adjacent plug or adjust the area of the lower surface of the upper adjacent plug such that it is larger than the area of the upper surface of the lower adjacent plug.

What is claimed is:

1. A method for fabricating a semiconductor device, the method comprising the steps of:

depositing a first conductive film on a semiconductor substrate;

forming a lower interlayer insulating film on the first conductive film and then selectively etching the lower interlayer insulating film to form a first opening reaching the first conductive film;

burying a second conductive film in the first opening to form a lower plug connected to the first conductive film;

forming a mask pattern on the lower interlayer insulating film and sequentially etching the lower interlayer insulating film and the first conductive film by using the mask pattern and the lower plug as a mask to form a lower-layer wire composed of the first conductive film and connected to the lower plug;

forming an upper interlayer insulating film on the semiconductor substrate such that an air gap is formed in a wire-to-wire space of the lower-layer wire;

selectively etching the upper interlayer insulating film to form a second opening reaching the lower plug;

burying a third conductive film in the second opening to form an upper plug connected to the lower plug; and forming an upper-layer wire on the upper interlayer insulating film such that the upper-layer wire is connected to the upper plug.

2. The method of claim 1, wherein the step of forming the lower plug includes the step of:

planarizing an upper surface of the lower interlayer insulating film such that the upper surface of the lower interlayer insulating film is flush with an upper surface of the lower plug.

3. The method of claim 1, wherein an area of the upper surface of the lower plug is larger than an area of a lower surface of the upper plug.

4. The method of claim 1, wherein the upper interlayer insulating film has a first insulating film deposited such that the air gap is formed and a second insulating film deposited on the first insulating film.

5. The method of claim 4, wherein the first insulating film is formed by plasma CVD and the second insulating film is formed by high-density plasma CVD using a plasma at a higher density than a plasma used for the plasma CVD.

6. The method of claim 4, wherein the upper interlayer insulating film further has a third insulating film deposited on the second insulating film and having a surface planarized.

7. The method of claim 6, wherein a major part of the upper plug is covered with the third insulating film.

8. The method of claim 4, wherein the second insulating film that has been formed is polished till the lower plug or the first insulating film is exposed, thereby having a surface planarized.

* * * * *